United States Patent [19]

Weinert et al.

[11] Patent Number: 4,482,833
[45] Date of Patent: Nov. 13, 1984

[54] METHOD FOR OBTAINING ORIENTED GOLD AND PIEZOELECTRIC FILMS

[75] Inventors: Robert W. Weinert, Monroeville; Donald H. Watt, Turtle Creek, both of Pa.

[73] Assignee: Westinghouse Electric Corp., Pittsburgh, Pa.

[21] Appl. No.: 568,309

[22] Filed: Jan. 4, 1984

Related U.S. Application Data

[62] Division of Ser. No. 249,805, Apr. 1, 1981, Pat. No. 4,428,808.

[51] Int. Cl.$^3$ .............................................. H03H 9/40
[52] U.S. Cl. .............................. 310/313 A; 333/149; 333/154; 427/100
[58] Field of Search ...................... 310/313 R, 313 A; 333/147, 149, 141, 154; 156/610; 427/100, 53.1, 419.1; 428/415; 204/192

[56] References Cited

U.S. PATENT DOCUMENTS

| | | | |
|---|---|---|---|
| 3,543,058 | 11/1970 | Klemens | 333/141 |
| 3,632,439 | 4/1972 | De Klerk | 117/215 |
| 3,655,429 | 4/1972 | De Klerk | 117/106 |
| 3,689,784 | 9/1972 | De Klerk | 333/154 |
| 3,825,779 | 7/1974 | De Klerk | 310/313 |
| 4,174,422 | 11/1979 | Matthews et al. | 428/621 |
| 4,194,171 | 3/1980 | Jelks | 333/149 |
| 4,428,808 | 1/1984 | Weinert et al. | 204/192 C |

Primary Examiner—J. D. Miller
Assistant Examiner—D. L. Rebsch
Attorney, Agent, or Firm—W. G. Sutcliff

[57] ABSTRACT

A transducer with thin films of gold having a high degree of orientation on surfaces previously yielding only unoriented gold has a layer of glass over the surface of the substrate material followed by a layer of oriented gold over the layer of glass. The added layer of piezoelectric material over the layer of oriented gold provides piezoelectric material having good orientation due to the oriented gold. Addition of a top conductive electrode forms a transducer wherein the piezoelectric material has a high degree of orientation.

10 Claims, 6 Drawing Figures

METHOD FOR OBTAINING ORIENTED GOLD AND PIEZOELECTRIC FILMS

GOVERNMENT CONTRACT

The government has rights in this invention pursuant to Contract No. N00140-79-C-6282 awarded by the Department of the Navy.

This is a division of application Ser. No. 249,805, filed Apr. 1, 1981, now U.S. Pat. No. 4,428,808.

BACKGROUND OF THE INVENTION

1. Field of the Invention

This invention relates to thin films used for fabricating bulk wave and surface acoustic wave transducers and more particularly to thin films of polycrystalline material or crystallites each having a crystalline orientation oriented in a preferred direction.

2. Description of the Prior Art

Bulk and surface acoustic wave transducers are fabricated with thin layers of piezoelectric material such as zinc oxide (ZnO). The transducers are used, for example, to fabricate delay lines when the delay medium is non-piezoelectric. For high frequencies greater than 100 MHz the piezoelectric material such as zinc oxide is usually sputtered onto the substrate or medium for propagation. In most bulk wave devices and in some surface acoustic wave devices the substrate or propagation medium is first coated with a thin metal layer such as gold which serves as one electrode of the piezoelectric transducer. The piezoelectric material is sputtered onto the gold and then a second metal film such as gold is deposited on top of the piezoelectric material to form the second electrode.

In order for the sputtered piezoelectric material such as zinc oxide to be useful as a piezoelectric transducer, the piezoelectric material or zinc oxide layer must have a high degree of crystalline C-axis orientation normal to the plane of the layer. The sputtered piezoelectric material may comprise many crystallites, but each crystallite should have its C-axis oriented normal to the plane of the layer. The other axes of the piezoelectric material, such as in the basal plane of a hexagonal crystalline material such as zinc oxide, does not have to be aligned with respect to other crystallites for good transduction to take place, so long as the C-axis of the hexagonal crystalline material is aligned normal to the layer of the piezoelectric material.

It is known that zinc oxide will have good crystalline C-axis orientation if it is sputtered onto thermally evaporated gold which itself has good <111> axis orientation normal to the metal layer. In other words, in the prior art, good piezoelectric transducers could be obtained by using a bottom electrode of gold having its <111> axis oriented normal to the gold layer followed by a zinc oxide layer having its crystalline C-axis of the various crystallites oriented normal to the plane of the layer or close thereto, as measured by reflection electron diffraction patterns. A top layer of gold forms the top of electrode of the transducer.

It is known that thermally evaporated gold will have its <111> axis oriented normal to the gold layer on the following materials: spinel, sapphire, lithium niobate, fused quartz and ordinary microscope slides.

The deposition of piezoelectric films having their C-axis perpendicular to the film is described in U.S. Pat. No. 3,655,429 which issued on Apr. 11, 1972 to John DeKlerk and assigned to the assignee herein. In U.S. Pat. No. 3,655,429 at column 12 the formation of zinc oxide films were found to have a high degree of orientation on an oriented substrate such as crystalline material. The degree of orientation was also affected by the rate of deposition and the temperature of the substrate during deposition.

U.S. Pat. No. 3,825,779 which issued on July 23, 1974 entitled "Interdigital Mosaic Thin Film Shear Transducer" by John DeKlerk describes depositing cadmium sulfide or zinc oxide on a layer of gold on a substrate of aluminum oxide ($Al_2O_3$). A mosaic thin film shear transducer was described having the C-axis inclined at an angle of 40 degrees to the normal to the piezoelectric film layer.

U.S. Pat. No. 3,689,784 which issued on Sept. 5, 1972 entitled "Broadband, High Frequency, Thin Film Piezoelectric Transducers" by John DeKlerk and assigned to the assignee herein describes a transducer comprising a single layer of piezoelectric material such as cadmium sulfide and electrode structures of gold formed on a substrate of lithium niobate.

U.S. Pat. No. 3,632,439 which issued on Jan. 4, 1972 entitled "Method Of Forming Thin Insulating Films Particularly For Piezoelectric Transducer" by John DeKlerk and assigned to the assignee herein describes the formation of cadmium sulfide films on single crystal substrates with oriented A and C axes. The desirability of having the C-axis normal to the plane of the film is described as desirable to form high frequency piezoelectric transducer films.

U.S. Pat. No. 3,543,058 which issued on Nov. 24, 1970 entitled "Piezoelectric Transducer" by P. G. Klemens and assigned to the assignee herein describes the formation of a acoustic transducer having alternate layers of piezoelectric material wherein at least one layer has different electromechanical properties.

It is therefore desirable to form layers of gold having a predetermined orientation among its crystallites on substrate materials where heretofore only unoriented gold layers were formed.

It is further desirable to form an electrode of gold having its <111> axis oriented normal to its layer on films of thermally formed silicon dioxide and of sputtered silicon dioxide.

It is further desirable to form oriented layers of piezoelectric material on substrate materials where heretofore only poor orientation was obtained.

It is further desirable to form electro-acoustic transducers having superb characteristics of oriented piezoelectric material on substrate materials where heretofore only transducers having poor characteristics typical of unoriented piezoelectric material were formed.

SUMMARY OF THE INVENTION

In accordance with the present invention, a method is described for depositing a layer of gold having a preferred crystalline orientation on the surface of a material which normally produces a layer of gold having no preferred crystalline orientation by sputtering a layer of glass over the surface of the material and depositing a layer of gold over the layer of sputtered glass.

The invention further provides a method for depositing piezoelectric material having a predetermined crystalline orientation by the steps of sputtering a layer of glass over the upper surface of a substrate, depositing a layer of gold over the layer of sputtered glass and depositing the piezoelectric material over the layer of gold.

The invention further provides a transducer for generating acoustic waves in a substrate in response to electrical signals comprising a substrate having an upper surface which previously provided unoriented gold, a layer of glass deposited or sputtered thereover, a layer of oriented gold deposited thereover, a layer of piezoelectric material deposited over the gold, a layer of conductive material deposited over the piezoelectric material and means for coupling an input signal to the layer of gold and the conductive layer.

DESCRIPTION OF THE PREFERRED EMBODIMENT

Figure 1:
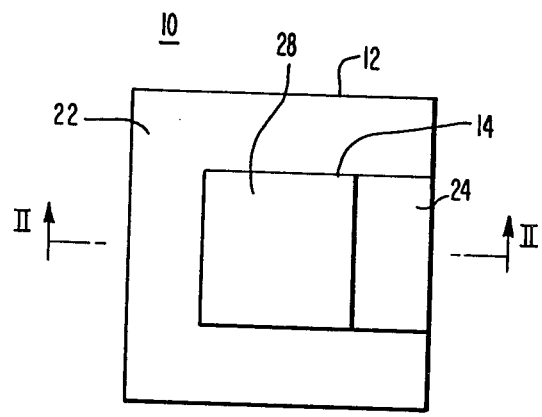
FIG. 1 is a top view of a transducer.
Figure 2:
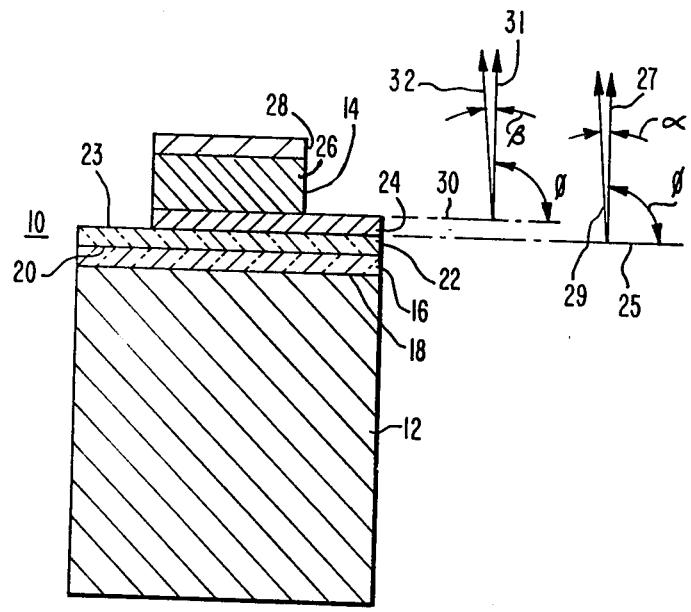
FIG. 2 is a cross-section view along the lines II—II of FIG. 1.

Referring to the drawing and in particular to FIGS. 1 and 2, an electro-acoustic device such as the delay line 10 is shown having a substrate 12 suitable for propagating acoustic waves and a transducer 14 suitable for generating acoustic waves. Substrate 12 may, for example, be a semiconductor material such as silicon, germanium, gallium arsenide or it may be nonsemiconducting material suitable for propagating acoustic waves. A layer of dielectric 16 is formed on the upper surface 18 of substrate 12. Dielectric layer 16 may, for example, be silicon dioxide thermally grown or sputtered on the upper surface of a silicon substrate 12 or deposited by chemical vapor deposition on the upper surface 18.

Dielectric layer 16 or substrate 12 without dielectric layer 16 may, for example, have an upper surface 20 which may or may not result in a layer of oriented gold having its <111> axis normal to the plane of the layer when deposited thereon. Therefore, in place of depositing gold directly on upper surface 20 of dielectric layer 16 or substrate 12 without dielectric layer 16, a layer 22 of glass such as Corning 7059 glass is deposited thereon. Corning 7059 glass obtained from Corning Glass Works, Corning, N.Y. was chosen because from tests it was found that gold films deposited thereon are oriented with the <111> axes normal to the film layer. The target used for sputtering was ⅛" thick by 6" in diameter. Other materials which orient the <111> axes of gold normal to the film layer may be deposited such as by sputtering to form layer 22. The composition of Corning 7059 glass includes silicon dioxide 50.2%, barium oxide 25.1%, boron oxide 13.0%, aluminum oxide 10.7%, arsenic oxide 0.4% and other constituents 1.6% as measured by other. The glass 7059 may be deposited by sputtering and may have a thickness of 1,000 Angstroms. Glass layer 22 has been formed by sputtering Corning 7059 glass at the rate of 1,000 Angstroms/hour for one hour. The thickness of the glass 7059 was chosen arbitrarily as being thick enough at least 400 Angstroms to buffer the underlying layer of dielectric 16 and thin enough to be acoustically thin at the frequency of interest of a completed transducer.

By acoustically thin, glass layer 22 should have a thickness less than $\lambda/10$ where $\lambda$ is the wavelength of the frequency designed for transducer operation. For example, at 1 GHz, $\lambda$ is 5 micrometers. For a thickness of 1000 Angstroms at 1 GHz, the thickness corresponds to $\lambda/50$. At 3 GHz, the thickness corresponds to $\lambda/16.7$.

A thin layer of chrome (not shown) having a thickness of about 400 Angstroms was deposited over layer 22 for adherence followed by a deposition of 1,200 Angstroms of gold to form gold layer 24 over layer 22. The thickness of the gold depends upon acceptable ohmic loss of the transducer and the acceptable acoustic loading. The gold was deposited at a rate of about 100 Angstroms/second. The deposition of the gold was performed by thermally evaporating the gold which is well known in the art. The resulting gold layer 24 over layer 22 was highly oriented having its <111> axis orientation normal to the layer 24 within a small angle $\alpha$. It is desirable for angle $\alpha$ to be less than 5 degrees.

In FIG. 2, the upper surface 23 of glass layer 22 is shown to contain reference line 25 which is parallel to glass layer 22 and gold layer 24. Arrow 27 is normal to glass layer 22 or at an angle $\theta=90$ degrees to reference line 25. Arrow 29 is at an angle $\alpha$ with respect to arrow 27. Arrow 29 may be rotated around the axis of arrow 27 to form a cone representing all possible orientations within an angle $\alpha$ to arrow 27.

A layer of piezoelectric material 26 is deposited over gold layer 24. The piezoelectric material 26 may, for example, be zinc oxide which may be sputtered. A more detailed description of forming piezoelectric layers may be found in U.S. Pat. No. 3,655,429 which issued on Apr. 11, 1972 entitled "Method Of Forming Thin Insulating Films Particularly For Piezoelectric Transducers" by John DeKlerk and assigned to the assignee herein which is incorporated herein by reference.

Piezoelectric layer 26 has a preferred crystalline orientation which results from its deposition over oriented gold wherein the gold layer has a preferred crystalline orientation. For example, where the piezoelectric material is zinc oxide the C-axis of the zinc oxide has a preferred orientation normal to the layer of zinc oxide.

In FIG. 2, the lower surface of piezoelectric layer 26 is shown to contain reference line 30 which is parallel to reference line 25 and piezoelectric layer 26. Arrow 31 is normal to piezoelectric layer 26 or at an angle $\phi=90$ degrees to reference line 30. Arrow 32 is at an angle $\beta$ with respect to arrow 31. Arrow 32 may be rotated around the axis of arrow 31 to form a cone representing all possible orientation within an angle $\beta$ to arrow 31. The degree of orientations within a small angle $\beta$ of the many crystallites with respect to the normal to the layer, arrow 31, of zinc oxide is an important factor in achieving high quality transducers. The better the orientation of the zinc oxide or the smaller the angle $\beta$ to the normal of layer 26, the more efficient the resulting transducer 14 will be.

A layer of conductive material 28 is formed over the piezoelectric layer 26 to form the upper electrode of transducer 14. As shown in FIGS. 1 and 2 transducer 14 is suitable for generating bulk acoustic waves into substrate 12. Electrical signals may be coupled between the upper electrode layer 28 and the lower electrode layer 24 to provide a voltage across piezoelectric layer 26. Piezoelectric material 26 in response to receiving bulk acoustic waves may generate electrical signals across layer 26 which are coupled out through upper electrode layer 28 and lower electrode layer 24.

Figure 3:
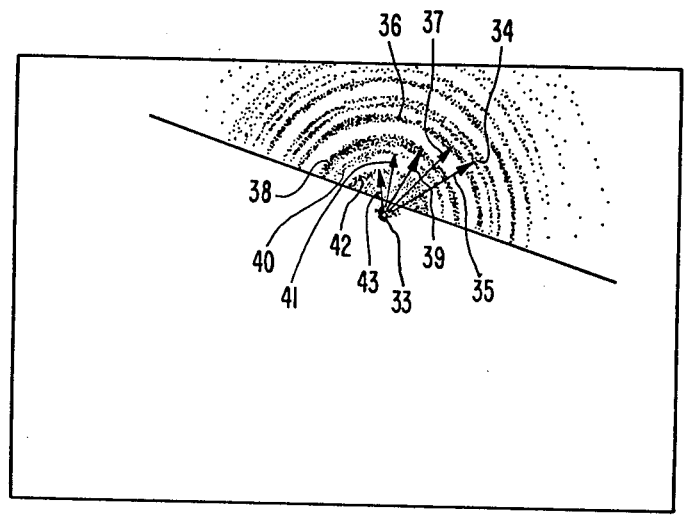
FIG. 3 is a pattern formed utilizing reflection electron diffraction of unoriented gold.

FIG. 3 shows a reflection electron defraction pattern for thermally evaporated gold deposited over a layer of sputtered SiO2 having a thickness of about 1,000 Angstroms. In FIG. 3 curves 34, 36, 38, 40 and 42 show circular arcs having a common origin 3 and a radius of various amplitudes shown by arrows 35, 37, 39, 41 and 43. The extension of the arcs through an angle of over 90 degrees with respect to the origin 33 show that the gold is unoriented and that the crystal axes such as [111] of various crystallites within the gold layer point in many directions.

Figure 4:
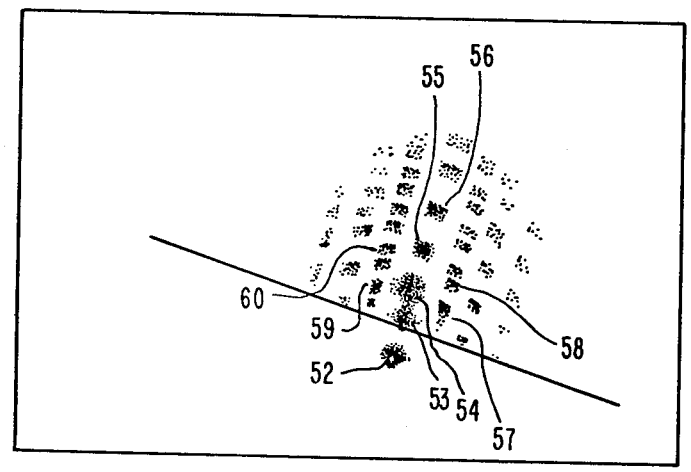
FIG. 4 is a pattern for reflection electron diffraction of oriented gold.

FIG. 4 shows a reflection electron diffraction pattern for thermally evaporated gold on a layer of sputtered Corning 7059 glass having a thickness of about 1,000 Angstroms. FIG. 4 shows sharp spots 53 through 60 with respect to the origin 52 showing a high degree of <111> axis orientation normal to the plane or layer of the sputtered glass and gold. The many crystallites in the gold layer all have their <111> axes normal to the gold layer 24 within a small angle α resulting in a very high degree of orientation. Angle α may be as small as 1½ degrees for oriented gold. If the gold was unoriented, then the spots 53 through 60 would degenerate into a number of arcs the length of which would depend upon the degree of unoriented gold. Angle α may be measured from the pattern as equal to ½ the angular width of the spot with respect to the origin 52.

Figure 5:
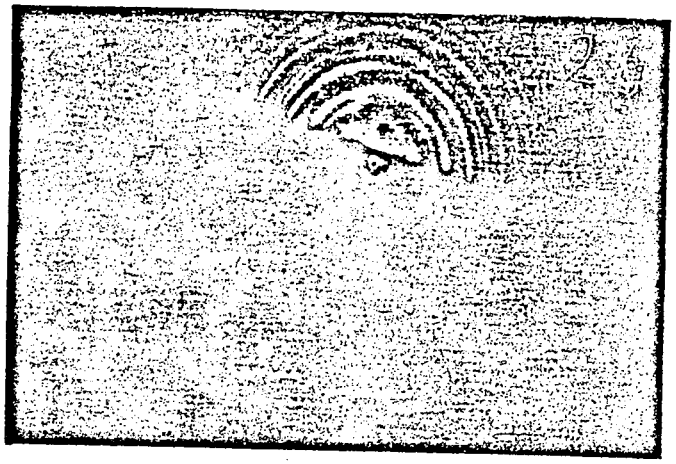
FIG. 5 is a reproduction of a photograph of a reflection electron diffraction pattern from which FIG. 3 was derived.

FIG. 5 is a reproduction of a photograph showing in fine detail a reflection electron diffraction pattern from which FIG. 3 was derived. In FIG. 5 a film of unoriented gold was measured.

Figure 6:
FIG. 6 is a reproduction of a photograph of a reflection electron diffraction pattern from which FIG. 4 was derived.

FIG. 6 is a reproduction of a photograph showing in fine detail a reflection electron diffraction pattern from which FIG. 4 was derived. In FIG. 6 a film of oriented gold was measured.

Since gold films thermally evaporated on certain materials have a high degree of orientation or order, oriented layers of gold on substrates on which gold normally does not orient itself may be achieved by covering the substrate with thin layers of material on which gold orients itself. The thin layer provides a buffer between the substrate and results in a layer of oriented gold when thermally deposited thereon. One example of a thin layer is Corning 7059 glass which may be deposited to a thickness of 1,000 Angstroms by sputtering.

The invention describes a method for depositing a layer of gold having a preferred crystalline orientation on the surface of a material which normally produces a layer of gold having no preferred crystalline orientation by sputtering a layer of glass over the surface of the material prior to depositing a layer of gold over the layer of glass.

The invention further describes a method for depositing piezoelectric material having a predetermined crystalline orientation by sputtering a layer of glass over the upper surface of the substrate, depositing a layer of gold over the layer of glass, and depositing the piezoelectric material over the layer of gold.

The invention further provides a transducer for generating acoustic waves in a substrate in response to electrical signals comprising depositing a layer of silicon dioxide on the upper surface of the substrate, depositing a layer of glass over the layer of silicon dioxide, depositing a layer of gold over the glass, depositing piezoelectric material over the gold layer, depositing a layer of conductive material over the piezoelectric material and coupling input lines to the gold layer and the top conductive layer for coupling electrical signals to and from the transducer.

We claim:

1. A transducer for generating acoustic waves in response to electrical signals in a substrate having a surface which does not orient gold comprising:

a first layer of glass deposited over said surface of said material, a second layer of gold deposited over said second layer, a third layer of piezoelectric material deposited over said second layer, a fourth layer of conductive material formed over said third layer, and means for coupling an electrical signal between said second and fourth layers.

2. The transducer of claim 1 wherein said first layer of glass has a thickness of at least 500 Angstroms.

3. The transducer of claim 1 wherein said first layer of glass includes silicon dioxide and barium oxide.

4. The transducer of claim 3 wherein said first layer of glass further includes boron oxide.

5. The transducer of claim 1 wherein said second layer of gold has its <111> axes of its various crystallites within an acute angle α of the normal to the layer of gold.

6. The transducer of claim 5 wherein said angle α is less than 5°.

7. The transducer of claim 5 wherein said third layer of piezoelectric material has a preferred axis of its various crystallites within an acute angle β of the normal to the layer of piezoelectric material.

8. The transducer of claim 7 wherein said third layer of piezelectric material is zinc oxide and wherein said preferred axis is its C-axis.

9. The transducer of claim 7 wherein said angle β is less than 5°.

10. The transducer of claim 5 wherein said angle α is less than 1.6°.

* * * * *